(12) United States Patent
Jang

(10) Patent No.: US 11,942,492 B2
(45) Date of Patent: Mar. 26, 2024

(54) IMAGE SENSING DEVICE

(71) Applicant: SK hynix Inc., Icheon-si (KR)

(72) Inventor: Jae Hyung Jang, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 413 days.

(21) Appl. No.: 17/402,334

(22) Filed: Aug. 13, 2021

(65) Prior Publication Data

US 2022/0223639 A1 Jul. 14, 2022

(30) Foreign Application Priority Data

Jan. 12, 2021 (KR) .................. 10-2021-0003960

(51) Int. Cl.
*H01L 23/00* (2006.01)
*H01L 27/146* (2006.01)
*H04N 25/75* (2023.01)

(52) U.S. Cl.
CPC .. *H01L 27/14614* (2013.01); *H01L 27/14616* (2013.01); *H01L 27/14625* (2013.01); *H01L 27/1463* (2013.01); *H04N 25/75* (2023.01)

(58) Field of Classification Search
CPC ......... H01L 27/41616; H01L 27/14625; H01L 27/1463
See application file for complete search history.

(56) References Cited

U.S. PATENT DOCUMENTS

2021/0159335 A1* 5/2021 Ni .................. H01L 29/0696

FOREIGN PATENT DOCUMENTS

| KR | 101696335 B1 | 1/2017 |
| KR | 20190127667 A | 11/2019 |
| KR | 20190127677 A | 11/2019 |

* cited by examiner

*Primary Examiner* — Anthony Ho
(74) *Attorney, Agent, or Firm* — Perkins Coie LLP

(57) ABSTRACT

An image sensing device includes a semiconductor substrate, a photoelectric conversion region structured to generate charge carriers from incident light and capture the charge carriers using an electric potential difference caused by a demodulation control signal applied to the photoelectric conversion region, and a circuit region disposed adjacent to the photoelectric conversion region, the circuit region including a plurality of pixel transistors that generate and output a pixel signal corresponding to the charge carriers captured by the photoelectric conversion region. The circuit region includes a first well region formed to have a first length in a first direction, and a second well region formed below the first well region such that a lower end of the first well region is in contact with an upper end of the second well region, and formed to have a second length shorter than the first length in the first direction.

20 Claims, 9 Drawing Sheets

IMAGE SENSING DEVICE

CROSS-REFERENCE TO RELATED APPLICATION

This patent document claims the priority and benefits of Korean patent application No. 10-2021-0003960, filed on Jan. 12, 2021, which is incorporated by reference in its entirety as part of the disclosure of this patent document.

TECHNICAL FIELD

The technology and implementations disclosed in this patent document generally relate to an image sensing device.

BACKGROUND

An image sensor is a device for capturing optical images by converting light into electrical signals using a photosensitive semiconductor material which reacts to light. With the recent development of automotive, medical, computer and communication industries, the demand for high-performance image sensors is increasing in various fields such as smart phones, digital cameras, camcorders, personal communication systems (PCSs), game consoles, IoT (Internet of Things), robots, surveillance cameras, medical micro cameras, etc.

SUMMARY

The embodiments of the disclosed technology relate to an image sensing device that can reduce power consumption while improving depth image characteristics.

In an embodiment of the disclosed technology, an image sensing device may include a semiconductor substrate, a photoelectric conversion region supported by the semiconductor substrate and structured to generate charge carriers from incident light and capture the charge carriers using an electric potential difference caused by a demodulation control signal applied to the photoelectric conversion region, and a circuit region supported by the semiconductor substrate and disposed adjacent to the photoelectric conversion region, the circuit region including a plurality of pixel transistors that generate and output a pixel signal corresponding to the charge carriers captured by the photoelectric conversion region. The circuit region may include a first well region formed to have a first length in a first direction, and a second well region formed below the first well region such that a lower end of the first well region is in contact with an upper end of the second well region and formed to have a second length shorter than the first length in the first direction.

In an embodiment of the disclosed technology, an image sensing device may include a substrate including a first region and a second region adjacent to the first region, a photoelectric conversion region formed in the substrate corresponding to the first region and including one or more demodulation nodes structured to receive a demodulation control signal and create an electric field and one or more detection nodes structured to collect photo generated charge carriers, a circuit region including circuitry formed on the substrate corresponding to the second region to process the photo generated charge carriers collected by the one or more detection nodes, a first well region doped with a first impurity and formed under the circuitry in the substrate corresponding to the second region to have a first width and a first depth, and a second well region doped with a second impurity and formed under the first well region in the substrate corresponding to the second region to have a second width and a second depth from a bottom surface of the first well region.

In an embodiment of the disclosed technology, an image sensing device may include a photoelectric conversion region configured to generate charge carriers through conversion of incident light, and capture the charge carriers using a potential difference caused by a demodulation control signal, and a circuit region disposed at one side of the photoelectric conversion region, and configured to include a plurality of pixel transistors that generates and outputs a pixel signal corresponding to the charge carriers captured by the photoelectric conversion region. The circuit region may include a first well region formed to extend in a first direction to a first length, and a second well region formed below the first well region so as to be coupled to the first well region, and formed to extend in the first direction to a second length shorter than the first length.

It is to be understood that both the foregoing general description and the following detailed description of the disclosed technology are illustrative and explanatory and are intended to provide further explanation of the disclosure as claimed.

DETAILED DESCRIPTION

This patent document provides implementations and examples of an image sensing device and the disclosed features may be implemented to achieve one or more advantages in more applications. Some implementations of the disclosed technology suggest designs of an image sensing device which can reduce power consumption needed for sensing, and at the same time can improve depth characteristics.

Reference will now be made in detail to certain embodiments, examples of which are illustrated in the accompanying drawings. Wherever possible, the same reference numbers will be used throughout the drawings to refer to the same or similar parts. In the following description, a detailed description of related known configurations or functions incorporated herein will be omitted to avoid obscuring the subject matter.

In order to acquire a three-dimensional (3D) image using the image sensor, color information of the 3D image and the distance (or depth) between a target object and the image sensor are needed.

Methods for measuring depth information about a target object using one or more image sensors include a triangulation method and a time of flight (TOF) method. Among these depth measurement methods, the TOF method is being widely used because of its wide range of applications, a high processing speed, and a cost efficiency. In some implementations, the TOF method measures a distance using light emitted from the light source and light reflected from the object. The TOF method may be classified into two different types, a direct method and an indirect method, depending on whether a round-trip time or a phase difference of light is used to determine the distance between the TOF sensor and an object. The direct method may calculate a round trip time using emitted light and reflected light and measure the distance between the TOF sensor and a target object (i.e., depth) using the round-trip time. The indirect method may measure the distance between the TOF sensor and the target object using a phase difference. The direct method is used to measure a longer distance and thus is widely used in automobiles. The indirect method is used to measure a shorter distance and thus is used for a game machine or a mobile camera that is used at a shorter distance and requires a faster processing speed. The indirect TOF sensor can be implemented using a simple circuit at a low cost.

In some implementations, the indirect ToF sensor may utilize a current-assisted photonic demodulator (CAPD) structure for detecting electrons that have been generated in a substrate using a hole current acquired by applying a voltage to the substrate, such that the CAPD structure can more quickly detect electrons. In addition, the CAPD can detect electrons formed at a deep depth in the substrate.

Figure 1:
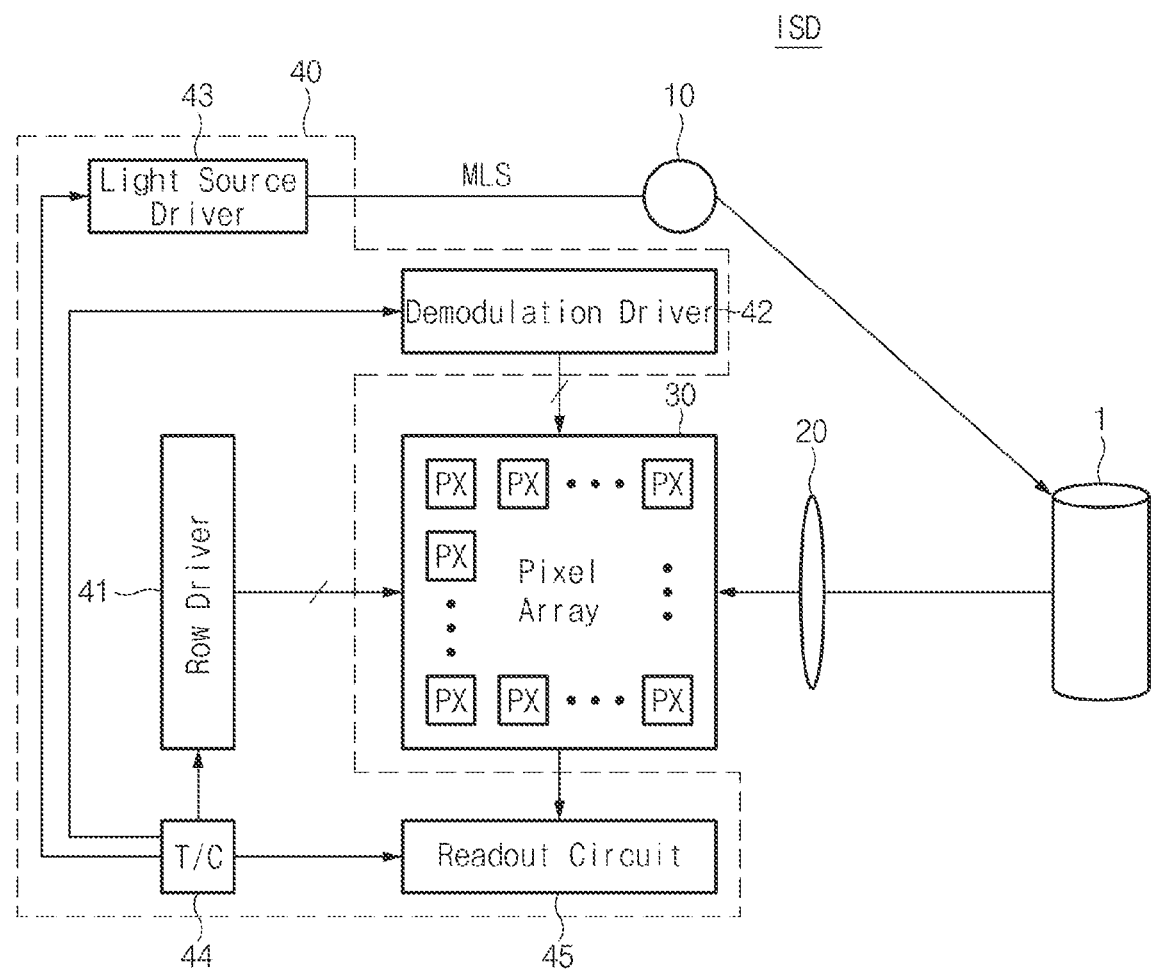
FIG. 1 is a block diagram illustrating an example of an image sensing device based on some implementations of the disclosed technology.

FIG. 1 is a block diagram illustrating an example of an image sensing device ISD based on some implementations of the disclosed technology.

Referring to FIG. 1, the image sensing device ISD may measure the distance between the image sensing device ISD and a target object 1 using the indirect Time of Flight (TOF) method. The TOF method based on some implementations may be a direct TOF method or an indirect TOF method. The indirect TOF method may measure the distance between the image sensing device ISD and the target object 1 by emitting modulated light to the target object 1, sensing light reflected from the target object 1, and calculating a phase difference between the modulated light and the reflected light.

The image sensing device ISD may include a light source 10, a lens module 20, a pixel array 30, and a control block 40.

The light source 10 may emit light to a target object 1 upon receiving a modulated light signal (MLS) from the control block 40. The light source 10 may be a laser diode (LD) or a light emitting diode (LED) for emitting light (e.g., near infrared (NIR) light, infrared (IR) light or visible light) having a specific wavelength band, or may be any one of a Near Infrared Laser (NIR), a point light source, a monochromatic light source combined with a white lamp or a monochromator, and a combination of other laser sources. For example, the light source 10 may emit infrared light having a wavelength of 800 nm to 1000 nm. Although FIG. 1 shows only one light source 10 by way of example, a plurality of light sources may also be arranged in the vicinity of the lens module 20.

The lens module 20 may collect light reflected from the target object 1, and may allow the collected light to be focused onto pixels (PXs) of the pixel array 30. For example, the lens module 20 may include a focusing lens having a surface formed of glass or plastic or another cylindrical optical element having a surface formed of glass or plastic. The lens module 20 may include a plurality of lenses that is arranged to focus light to an optical axis.

The pixel array 30 may include unit pixels (PXs) consecutively arranged in rows and columns in a two-dimensional (2D) matrix array. The unit pixels (PXs) may be formed over a semiconductor substrate. Each unit pixel (PX) may convert incident light received through the lens module 20 into an electrical signal corresponding to the amount of incident light rays, and may thus output a pixel signal using the electrical signal. In some implementations, the pixel signal may indicate the distance between the image sensing device ISD and the target object 1. For example, each unit pixel (PX) may be a current-assisted photonic demodulator (CAPD) pixel for capturing photocharges generated in a semiconductor substrate by incident light using a difference between electric potential levels of an electric field. The structure and operations of each unit pixel (PX) will hereinafter be described with reference to the drawings from FIG. 2.

The control block 40 may emit light to the target object 1 by controlling the light source 10. Upon receipt of the reflected light from the target object 1, the control block 40 may process each pixel signal corresponding to light reflected from the target object 1 by operating unit pixels (PXs) of the pixel array 30 and measure the distance between the image sensing device ISD and the surface of the target object 1 based on the pixel signal.

The control block 40 may include a row driver 41, a demodulation driver 42, a light source driver 43, a timing controller (T/C) 44, and a readout circuit 45.

In some implementations, the image sensing device ISD may include a control circuit such as the row driver 41 and the demodulation driver 42.

The control circuit may activate unit pixels (PXs) of the pixel array 30 in response to a timing signal generated from the timing controller 44.

The control circuit may generate a control signal that is used to select and control at least one row from among the plurality of rows in the pixel array 30. In some implementations, the control signal may include a demodulation control signal for generating a pixel current in the substrate, a reset signal for controlling a reset transistor, a transmission signal for controlling transmission of photocharges accumulated in a detection node, a floating diffusion signal for providing additional electrostatic capacity at a high illuminance level, a selection signal for controlling a selection transistor. The pixel current may include a current for moving photocharges generated by the substrate to the detection node.

In this case, the row driver 41 may generate a reset signal, a transmission signal, a floating diffusion signal, and a selection signal, and the demodulation driver 42 may generate a demodulation control signal. In some implementations, the row driver 41 and the demodulation driver 42 may be separate elements. In other implementations, the row driver 41 and the demodulation driver 42 may be incorporated into a single element disposed at one side of the pixel array 30.

The light source driver 43 may generate a modulated light signal MLS that is used to operate the light source 10 in response to a control signal from the timing controller 44. The modulated light signal MLS may be a signal that is modulated at a predetermined frequency.

The timing controller 44 may generate a timing signal to control the row driver 41, the demodulation driver 42, the light source driver 43, and the readout circuit 45.

The readout circuit 45 may process pixel signals received from the pixel array 30 based on the timing signal or other control signals provided by the timing controller 44, and may generate pixel data by converting analog pixel signals to digital signals. To this end, the readout circuit 45 may include a correlated double sampler (CDS) circuit for performing correlated double sampling (CDS) on the pixel signals generated by the pixel array 30. In addition, the readout circuit 45 may include an analog-to-digital converter (ADC) for converting output signals of the CDS circuit into digital signals. In addition, the readout circuit 45 may include a buffer circuit that temporarily stores pixel data generated from the analog-to-digital converter (ADC) and outputs the pixel data based on the timing signal or other control signals provided by the timing controller 44. In some implementations, the pixel array 30 includes current-assisted photonic demodulator (CAPD) pixels. Therefore, two column signal lines for transmitting the pixel signal may be assigned to each column of the pixel array 30, and circuitry for processing the pixel signal generated from each column line may correspond to the respective column lines.

The light source 10 may emit light (i.e., modulated light) modulated at a predetermined frequency toward an object or scene (e.g., target objects 1) captured by the image sensing device ISD. The image sensing device ISD may sense modulated light (i.e., incident light) reflected from the target objects 1 included in the scene, and may thus generate depth information for each unit pixel (PX). A time delay between the modulated light and the incident light is determined based on the distance between the image sensing device ISD and each target object 1. The time delay may be determined based on a phase difference between the signal generated by the image sensing device ISD and the light modulation signal MLS controlling the light source 10. An image processor (not shown) may calculate a phase difference generated in the output signal of the image sensing device ISD, and may thus generate a depth image including depth information for each unit pixel (PX).

Figure 2:
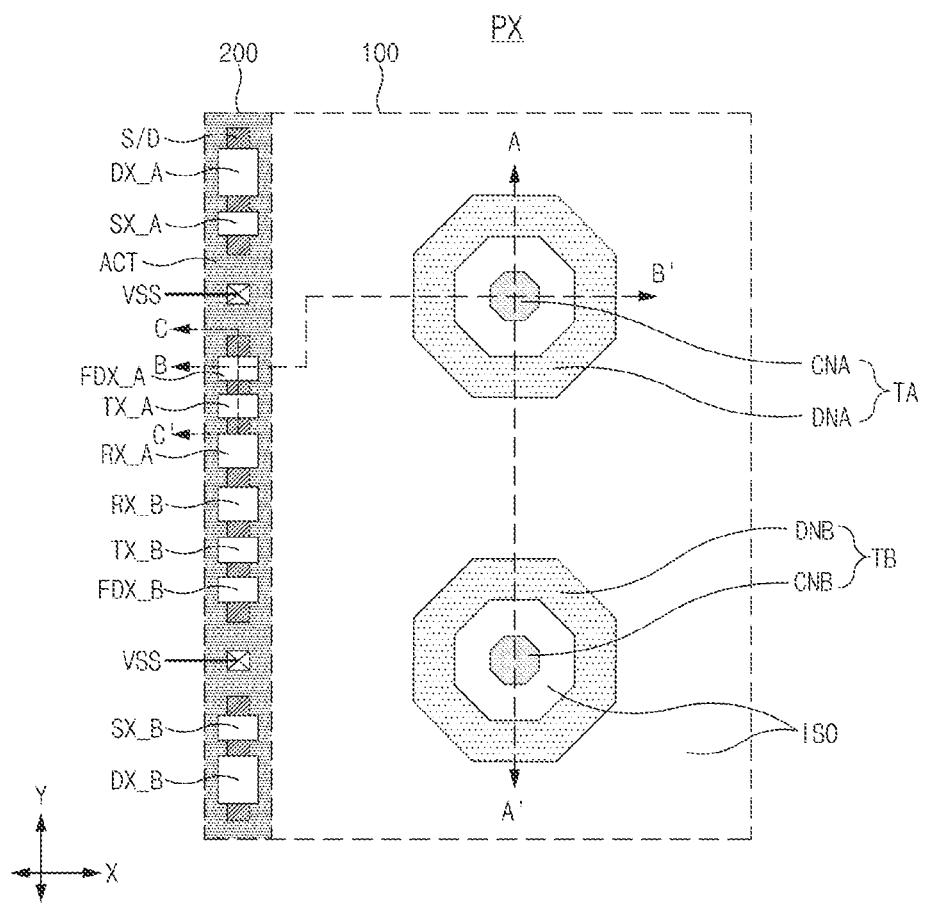
FIG. 2 is a diagram illustrating an example layout of a unit pixel included in a pixel array shown in FIG. 1 based on some implementations of the disclosed technology.

FIG. 2 is a schematic diagram illustrating an example layout of a unit pixel included in the pixel array 30 shown in FIG. 1 based on some implementations of the disclosed technology.

Referring to FIG. 2, the unit pixel PX may be any one of the plurality of pixels (PXs) shown in FIG. 1. FIG. 2 illustrates only one unit pixel PX by way of example, and other pixels PXs in the pixel array 30 may have the same structure and operate in the same way as the unit pixel PX illustrated in FIG. 2.

The unit pixel PX may include a photoelectric conversion region 100 and a circuit region 200.

The photoelectric conversion region 100 may include a first tap TA (or a first demodulation node) and a second tap TB (or a second demodulation node) that are formed in a semiconductor substrate. Although FIG. 2 shows the photoelectric conversion region 100 of a unit pixel PX as including two taps TA and TB, a unit pixel PX may include three or more taps. In some implementations, the plurality of taps may receive the same demodulation control signal. In other implementations, the plurality of taps may receive demodulation control signals that have different phases and/or timings.

Although FIG. 2 shows the first tap TA and the second tap TB as being arranged in a Y-axis direction (or a column direction), the first tap TA and the second tap TB can also be arranged in an X-axis direction (or a row direction) or in a diagonal direction.

The first tap TA may include a first control node CNA and a first detection node DNA surrounding the first control node CNA. In some implementations, as illustrated in FIG. 2, the first control node CNA may have an octagonal shape and the first detection node DNA is structured to surround the octagonal first control node CNA. In other implementations, the first control node CNA may have any shape that allows the first detection node DNA to surround the first control node CNA.

The annular-shaped structure structured to surround the first control node CNA allows the first detection node DNA to have a large inner surface facing the first control node CNA. In this way, the first detection node DNA can more easily capture charge carriers moving along a pixel current formed by the first control node CNA. In other implementations, the first detection node DNA may not be formed in a single annular shape completely surround the first control node CNA, and may be formed in a manner that a plurality of elements separated each other surround the first control node CNA.

The second tap TB may include a second control node CNB and a second detection node DNB surrounding the second control node CNB. The second control node CNB and the second detection node DNB may correspond to the first control node CNA and the first detection node DNA, respectively.

The first and second control nodes CNA and CNB and the first and second detection nodes DNA and DNB may be formed in the substrate. For example, each of the first and second control nodes CNA and CNB may be a P-type impurity region, and each of the first and second detection nodes DNA and DNB may be an N-type impurity region.

The first control node CNA and the first detection node DNA may be spaced apart from each other by a predetermined distance corresponding to the width of a device isolation layer (ISO) that is structured to physically isolate the first control node CNA from the first detection node DNA. In addition, the second control node CNB and the second detection node DNB can also be isolated from each other by the device isolation layer (ISO). The device isolation layer (ISO) may include a shallow trench isolation (STI) structure formed by filling, with insulation materials, a trench formed by etching the substrate to a predetermined depth.

The first tap TA and the second tap TB may also be spaced apart from each other by the device isolation layer (ISO).

The circuit region 200 may be disposed at one side of the photoelectric conversion region 100. The circuit region 200 may include a plurality of pixel transistors DX_A, SX_A, FDX_A, TX_A, RX_A, DX_B, SX_B, FDX_B, TX_B, and RX_B for generating a pixel signal corresponding to charge carriers captured by the detection nodes DNA and DNB.

The pixel transistors DX_A, SX_A, FDX_A, TX_A, and RX_A may generate a pixel signal corresponding to charge carriers captured by the first detection node DNA, and may output the pixel signal. The pixel transistors DX_A, SX_A, FDX_A, TX_A, and RX_A may be disposed near the first tap TA.

The pixel transistors DX_B, SX_B, FDX_B, TX_B, and RX_B may generate a pixel signal corresponding to charge carriers captured by the second detection node DNB. The pixel transistors DX_B, SX_B, FDX_B, TX_B, and RX_B may be disposed near the second tap TB.

The pixel transistors DX_A, SX_A, FDX_A, TX_A, RX_A, DX_B, SX_B, FDX_B, TX_B, and RX_B may be arranged in the circuit region 200. In one example, the circuit region 200 may extend in one direction (e.g., Y direction as shown in FIG. 2). In this case, the pixel transistors DX_A, SX_A, FDX_A, TX_A, and RX_A for the first tap TA and the pixel transistors DX_B, SX_B, FDX_B, TX_B, and RX_B for the second tap TB may be arranged symmetrically to each other as shown in FIG. 2. A contact for applying a bias voltage VSS to a well region may be formed between the pixel transistors SX_A and FDX_A, and another contact for applying a bias voltage VSS to a well region may be formed between the pixel transistors SX_B and FDX_B. Here, the contact may include any type of structure with a gap filled with a conductive material.

The pixel transistors DX_A, SX_A, FDX_A, TX_A, RX_A, DX_B, SX_B, FDX_B, TX_B, and RX_B may be formed in an active region ACT. The active region ACT may be isolated from the taps TA and TB by the device isolation layer (ISO). The active region ACT may be formed over the entirety of the circuit region 200. For example, the active region ACT may be formed in a line shape extending in a Y-axis direction over the entirety of the circuit region 200. Each of gate terminals of the pixel transistors DX_A, SX_A, FDX_A, TX_A, RX_A, DX_B, SX_B, FDX_B, TX_B, and RX_B may have a narrower width in X direction than the active region ACT.

In the circuit region 200, a well (e.g., P-well) region may be formed in a manner that a width of an upper region of the well is different from a width of a lower region of the well. For example, the well (P-well) region may be formed in a manner that a width (i.e., width in X direction) of a well region formed below the active region ACT is smaller than that of a well region formed in the active region ACT.

Figure 3:
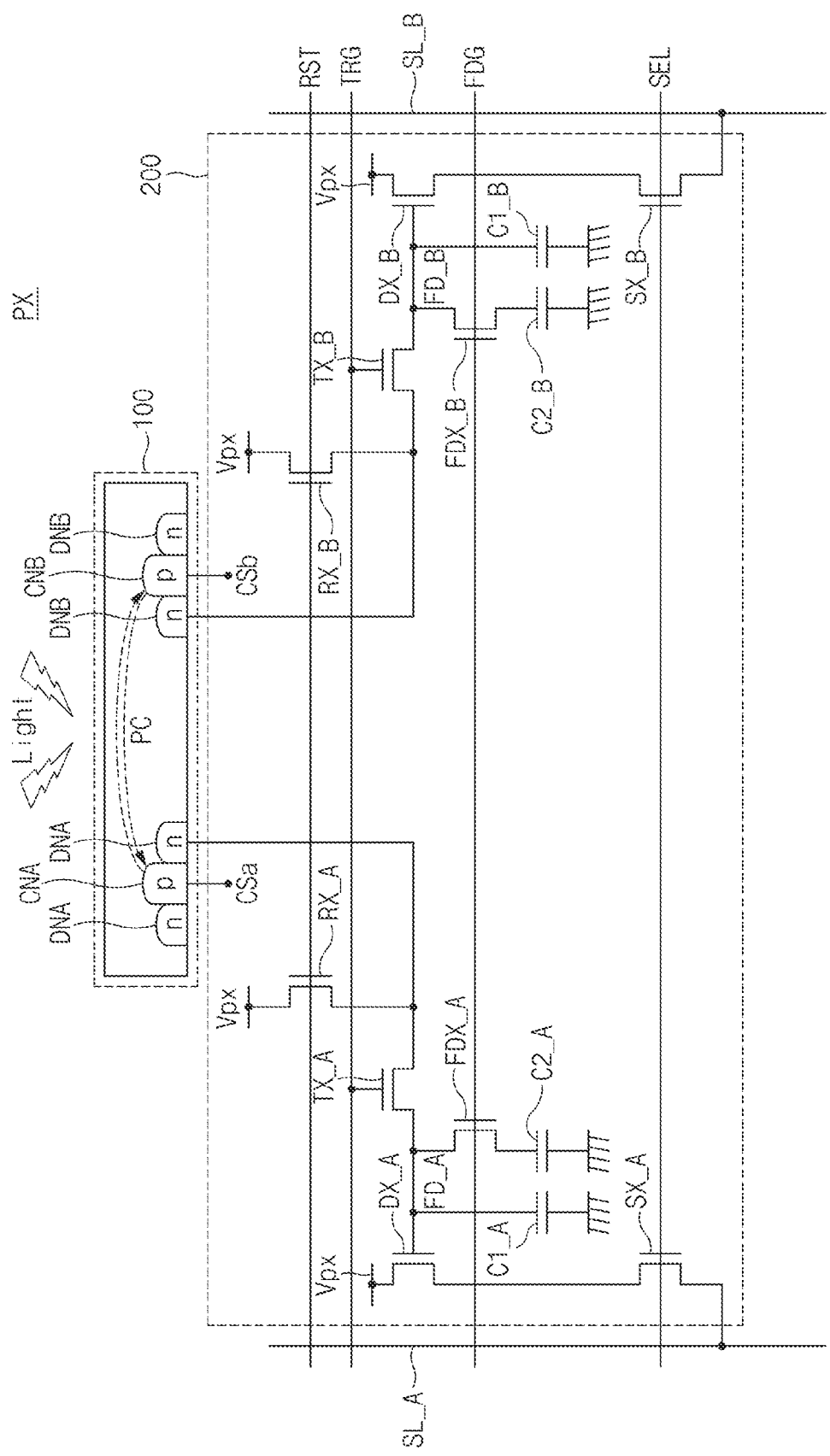
FIG. 3 is a diagram illustrating an example circuit that includes taps and pixel transistors included in the unit pixel shown in FIG. 2 based on some implementations of the disclosed technology.

FIG. 3 is a diagram illustrating an example circuit of the unit pixel shown in FIG. 2 based on some implementations of the disclosed technology. In FIG. 3, the photoelectric conversion region 100 shows a cross-sectional view of the photoelectric conversion region taken along the line A-A' shown in FIG. 2. The circuit region 200 shows the circuit diagram of the pixel transistors.

Referring to FIG. 3, the first control node CNA may receive a first demodulation control signal (CSa) from the demodulation driver 42, and the second control node CNB may receive a second demodulation control signal (CSb) from the demodulation driver 42. A voltage difference between the first demodulation control signal (CSa) and the second demodulation control signal (CSb) may generate a pixel current (PC) that can be used to control the flow of charge carriers that are generated in the substrate by incident light. For example, when the first demodulation control signal (CSa) has a higher voltage than the second demodulation control signal (CSb), the pixel current (PC) may flow from the first control node CNA to the second control node CNB. In contrast, when the first demodulation control signal (CSa) has a lower voltage than the second demodulation control signal (CSb), the pixel current (PC) may flow from the second control node CNB to the first control node CNA.

Each of the first detection node DNA and the second detection node DNB may capture charge carriers moving along the flow of the pixel current PC, and may accumulate the captured charge carriers.

The photocharge can be captured in the photoelectric conversion region 100 during a first period and a second period that follows the first period.

In the first period, light incident upon the pixel PX may be converted into electron-hole pairs in the substrate. In some implementations, the photocharge may include such photo-generated electrons. In some implementations, the demodulation driver 42 may supply a first demodulation control signal (CSa) to the first control node CNA, and may supply a second demodulation control signal (CSb) to the second control node CNB. In one example, the first demodulation control signal (CSa) may have a higher voltage than the second demodulation control signal (CSb). Here, the voltage of the first demodulation control signal (CSa) may be defined as an active voltage or an activation voltage, and the voltage of the second demodulation control signal (CSb) may be defined as an inactive voltage or a deactivation voltage. For example, the voltage of the first demodulation control signal (CSa) may be set to 1.2 V, and the voltage of the second demodulation control signal (CSb) may be 0 V.

A voltage difference between the first demodulation control signal (CSa) and the second demodulation control signal (CSb) may create an electric field between the first control node CNA and the second control node CNB, and thus the pixel current PC may flow from the first control node CNA to the second control node CNB. That is, holes in the substrate may move toward the second control node CNB, and electrons in the substrate may move toward the first control node CNA.

Electrons moving toward the first control node CNA may be captured by the first detection node DNA adjacent to the first control node CNA. Therefore, electrons in the substrate may be used as charge carriers for detecting the intensity of incident light.

In the second period, light incident upon the pixel PX may be converted into electron-hole pairs. In some implementations, the demodulation driver 42 may supply the first demodulation control signal (CSa) to the first control node CNA, and may supply the second demodulation control signal (CSb) to the second control node CNB. In one example, the first demodulation control signal (CSa) may have a lower voltage than the second demodulation control signal (CSb). Here, the voltage of the first demodulation control signal (CSa) may be defined as an inactive voltage or deactivation voltage, and the voltage of the second demodulation control signal (CSb) may be defined as an active voltage or activation voltage. For example, the voltage of the first demodulation control signal (CSa) may be 0 V, and the voltage of the second demodulation control signal (CSb) may be set to 1.2 V.

A voltage difference between the first demodulation control signal (CSa) and the second demodulation control signal (CSb) may create an electric field between the first control node CNA and the second control node CNB, and the pixel current PC may flow from the second control node CNB to the first control node CNA. That is, holes in the substrate may move toward the first control node CNA, and electrons in the substrate may move toward the second control node CNB.

Electrons moving toward the second control node CNB may be captured by the second detection node DNB adjacent to the second control node CNB. Therefore, electrons in the substrate may be used as charge carriers for detecting the intensity of incident light.

In other implementations, the sequence of the first and second periods may vary, and thus the first period may follow the second period.

The circuit region 200 may include a plurality of elements (pixel transistors) DX_A, SX_A, FDX_A, TX_A, RX_A, DX_B, SX_B, FDX_B, TX_B, and RX_B structured to convert photocharges captured by the first and second detection nodes DNA and DNB into electrical signals. The circuit region 200 may further include interconnects such as metal lines structured to carry electrical signals between the elements DX_A, SX_A, FDX_A, TX_A, RX_A, DX_B, SX_B, FDX_B, TX_B, and RX_B. Control signals RST, TRG, FDG, and SEL may be supplied from the row driver 41 to the circuit region 200. In addition, a pixel voltage (Vpx) may be a power-supply voltage (VDD).

The photocharges captured by the first detection node DNA may be converted into electrical signals as will discussed below. The circuit region 200 may include a reset transistor RX_A, a transfer transistor TX_A, a first capacitor C1_A, a second capacitor C2_A, a floating diffusion transistor FDX_A, a drive transistor DX_A, and a selection transistor SX_A.

The reset transistor RX_A may be activated to enter an active state in response to a logic high level of the reset signal RST supplied to a gate electrode thereof, such that the voltage of the floating diffusion node FD_A and the voltage of the first detection node DNA may be reset to the pixel voltage (Vpx) level. In addition, when the reset transistor RX_A is activated (i.e., active state), the transfer transistor TX_A can also be activated (i.e., active state) to reset the floating diffusion node FD_A.

The transfer transistor TX_A may be activated (i.e., active state) in response to a logic high level of the transfer signal TRG supplied to a gate electrode thereof, such that electrical charges accumulated in the first detection node DNA can be transmitted to the floating diffusion node FD_A.

The first capacitor C1_A may be coupled to the floating diffusion node FD_A, such that the first capacitor C1_A can provide predefined electrostatic capacity to the floating diffusion node FD_A. The second capacitor C2_A may be selectively coupled to the floating diffusion node FD_A based on the operations of the floating diffusion (FD) transistor FDX_A, such that the second capacitor C2_A can provide additional predefined electrostatic capacity to the floating diffusion node FD_A.

Each of the first capacitor C1_A and the second capacitor C2_A may include at least one of a metal-insulator-metal (MIM) capacitor, a metal-insulator-polysilicon (MIP) capacitor, a metal-oxide-semiconductor (MOS) capacitor, and a junction capacitor.

The floating diffusion transistor FDX_A may be activated in response to a logic high level of the floating diffusion signal FDG supplied to a gate electrode thereof, such that the floating diffusion transistor FDX_A may couple the second capacitor C2_A to the floating diffusion node FD_A.

For example, the row driver 41 may turn on (or activate) the floating diffusion transistor FDX_A when the intensity of incident light satisfies a predetermined high illuminance condition, such that the floating diffusion transistor FDX_A enters the active state and the floating diffusion node FD_A can be coupled to the second capacitor C2_A. As a result, when the incident light is at a high illuminance level, the photocharge accumulated at the floating diffusion node FD_A increases, accomplishing a high dynamic range (HDR).

On the other hand, when the incident light is at a relatively low illuminance level, the row driver 41 may turn off (or deactivate) the floating diffusion transistor FDX_A, such that the floating diffusion node FD_A can be isolated from the second capacitor C2_A.

In some other implementations, the floating diffusion transistor FDX_A and the second capacitor C2_A may be omitted as necessary.

A drain electrode of the drive transistor DX_A is coupled to the pixel voltage (Vpx) and a source electrode of the drive transistor DX_A is coupled to a vertical signal line SL_A through the selection transistor SX_A. A gate electrode of the drive transistor DX_A is coupled to the floating diffusion node FD_A, such that the drive transistor DX_A may operate as a source follower transistor for outputting a current (pixel signal) corresponding to potential of the floating diffusion node FD_A.

The selection transistor SX_A may be activated (i.e., active state) in response to a logic high level of the selection signal SEL supplied to a gate electrode thereof, such that the pixel signal generated from the drive transistor DX_A can be output to the vertical signal line SL_A.

In order to process photocharges captured by the second detection node DNB, the circuit region 200 may include a reset transistor RX_B, a transfer transistor TX_B, a first capacitor C1_B, a second capacitor C2_B, a floating diffusion transistor FDX_B, a drive transistor DX_B, and a selection transistor SX_B. The operation timing of elements for processing photocharges captured by the second detection node DNB is different from that of the elements for processing photocharges captured by the first detection node DNA. However, the elements for processing photocharges captured by the second detection node DNB may be similar or identical to the elements for processing photocharges captured by the first detection node DNA.

The pixel signal transferred from the circuit region 200 to the vertical signal lines SL_A and the pixel signal transferred from the circuit region 200 to the vertical signal line SL_B may be processed using a noise cancellation technique and analog-to-digital (ADC) conversion processing to convert the pixel signals into image data.

Although each of the reset signal RST, the transmission signal TRG, the floating diffusion signal FDG, and the selection signal SEL shown in FIG. 3 is supplied to the circuit region 200 through one signal line, each of the reset signal RST, the transmission signal TRG, the floating diffusion signal FDG, and the selection signal SEL can be supplied to the circuit region 200 through a plurality of signal lines (e.g., two signal lines), such that elements for processing photocharges captured by the first detection node DNA and the other elements for processing photocharges captured by the second detection node DNB can operate at different timings.

The image processor (not shown) may process the image data acquired from photocharges captured by the first detection node DNA and the image data acquired from photocharges captured by the second detection node DNB to produce a phase difference using the image data. The image processor may calculate depth information indicating the distance between the image sensor pixels and the target object 1 based on a phase difference corresponding to each pixel, and may generate a depth image including depth information corresponding to each pixel.

Figure 4A:
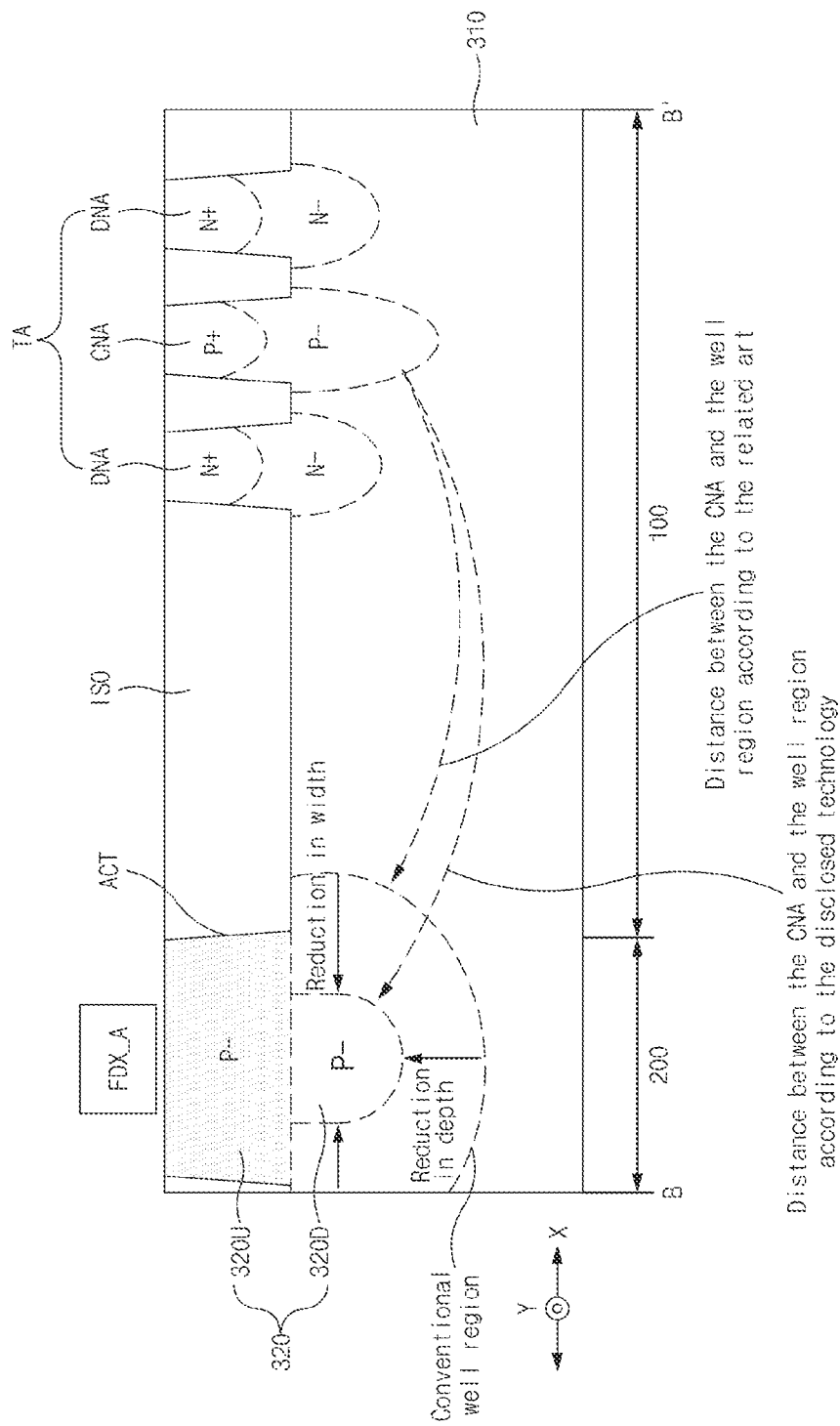
FIGS. 4A and 4B are cross-sectional views illustrating examples of the unit pixel taken along the line B-B' shown in FIG. 2 based on some implementations of the disclosed technology.
Figure 4B:
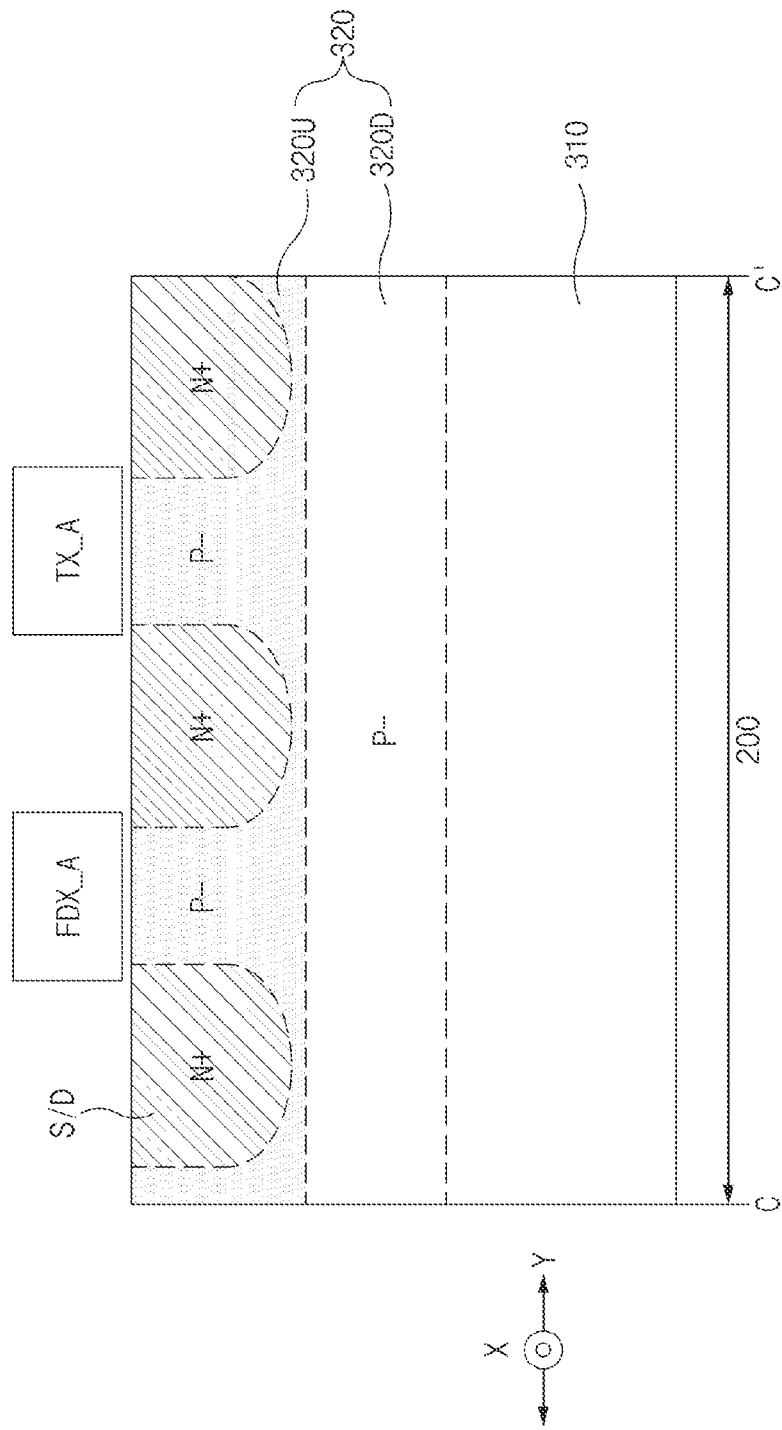

FIG. 4A is a cross-sectional view illustrating an example of the unit pixel taken along the line B-B' shown in FIG. 2 based on some implementations of the disclosed technology. FIG. 4B is a cross-sectional view illustrating an example of the unit pixel taken along the line C-C' shown in FIG. 2 based on some implementations of the disclosed technology.

Referring to FIGS. 4A and 4B, in the photoelectric conversion region 100, the first control node CNA may include P-type impurity regions (e.g., P⁻ region and P⁺ region) having different doping concentrations. For example, the P-type impurity region (e.g., P⁻ region) having a relatively low doping concentration may be formed in the substrate 310 to a first depth, and the P-type impurity region (e.g., P⁺ region) having a relatively high doping concentration may be formed in the substrate 310 to a second depth less than the first depth at the same position as the above P⁻-type impurity implantation position. In this case, the first depth may be greater than the second depth.

The first detection node DNA may have N-type impurity regions (e.g., N⁻ region and N⁺ region) having different doping concentrations. For example, the N-type impurity region (e.g., N⁻ region) having a relatively low doping concentration may be implanted into the substrate 310 to a first depth, and the N-type impurity region (e.g., N⁺ region) having a relatively high doping concentration may be implanted into the substrate 310 to a second depth less than the first depth at the same position as the above N⁻-type impurity implantation position. In this case, the depth of the P⁻-type impurity region of the first control node CNA may be greater than the depth of the N⁻-type impurity region of the first detection node DNA, thereby facilitating flow of the pixel current PC.

Although FIG. 4A illustrates only the first tap TA, the second control node CNB and the second detection node DNB of the second tap TB may have the same structures as the first control node CNA and the first detection node DNA of the first tap TA, respectively.

In the circuit region 200, the well region 320 may include an upper well region 320U and a lower well region 320D having different X-directional widths.

In some implementations, the upper well region 320U may be formed over the entirety of the active region ACT. Impurity regions such as source/drain regions (S/D) of the pixel transistors DX_A, SX_A, FDX_A, TX_A, RX_A, DX_B, SX_B, FDX_B, TX_B, and RX_B may be formed in the upper well region 320U. The upper well region 320U may include P-type (P⁻) impurities.

The lower well region 320D may be formed below the active region ACT so that the lower well region 320D can be in contact with a bottom surface of the upper well region 320U. For example, the lower well region 320D may be formed to protrude downward from the bottom surface of the upper well region 320, such that a top surface of the lower well region 320D is in contact with the bottom surface of the upper well region 320U. In some implementations, the depth of the lower well region 320D may be less than the depth of each of the control nodes CNA and CNB. The lower well region 320D may include P-type (P⁻) impurities having the same doping concentration as the upper well region 320U.

In addition, the width (length in X direction) of the lower well region 320D may be less than the width of the upper well region 320U. For example, the lower well region 320D may be formed to extend in the Y direction such that the Y-directional length of the extended lower well region 320D is similar or identical to that of the upper well region 320U, the width (length in X direction) of the extended lower well region 320D is less than that of the upper well region 320U. In some implementations, the Y-directional length of each of the upper well region 320U and the lower well region 320D may be identical to that of the circuit region 200 of the corresponding unit pixel.

In a conventional circuit region formed to include pixel transistors, a region formed below the active region from among the well region may extend to a lower portion of a device isolation layer (ISO) in a manner that both sides of the region vertically overlap with the device isolation layer (ISO) of the photoelectric conversion region, and the region formed below the active region may also extend in a downward direction. However, in some implementations of the disclosed technology, in forming the well region 320 of the circuit region 200 including pixel transistors therein, the width of the lower well region 320D formed below the active region ACT may be less than the width of the upper well region 320U, and the depth of the lower well region 320D may be less than the depth of the impurity region (P⁻ region) of each of the control nodes CNA and CNB.

Since the lower well region 320D is formed to have a smaller width as described above, the well region 320 may be spaced farther away from the control nodes CNA and CNB than the other case in which the lower well region 320D is formed to have a larger width. Moreover, when the lower well region 320D is formed to have a smaller depth, a distance between the well region 320 and each of the control nodes CNA and CNB becomes longer. That is, as shown in FIG. 4A, as the distance between the well region 320 and each of the control nodes CNA and CNB increases, resistance between the well region 320 and each of the control nodes CNA and CNB also increases.

As described above, in some implementations, as the distance between the well region 320 and each of the control nodes CNA and CNB becomes longer, resistance between the well region 320 and each of the control nodes CNA and CNB increases, such that leakage of a current (pixel current) flowing from the control nodes CNA and CNB to the circuit region 200 decreases, thereby reducing power consumption. In addition, as leakage of the pixel current decreases, the pixel current can be more concentrated into the photoelectric conversion region 100, thereby improving the depth characteristics.

However, if the well region 320 is formed to have a smaller width in the same manner as in the lower well region 320D, a dark current may occur in a region (e.g., edge region) in which the well region is not formed in an active region. Accordingly, in some implementations, the upper well region 320U may be entirely formed in the active region ACT.

The lower well region 320D may be formed below the upper well region 320U in a manner that the Y-directional center axis of the lower well region 320D can overlap with that of the upper well region 320U. The width (length in X direction) of the lower well region 320D may be larger than that of the source/drain regions (S/D) of the pixel transistors DX_A, SX_A, FDX_A, TX_A, RX_A, DX_B, SX_B, FDX_B, TX_B, and RX_B.

Figure 5A:
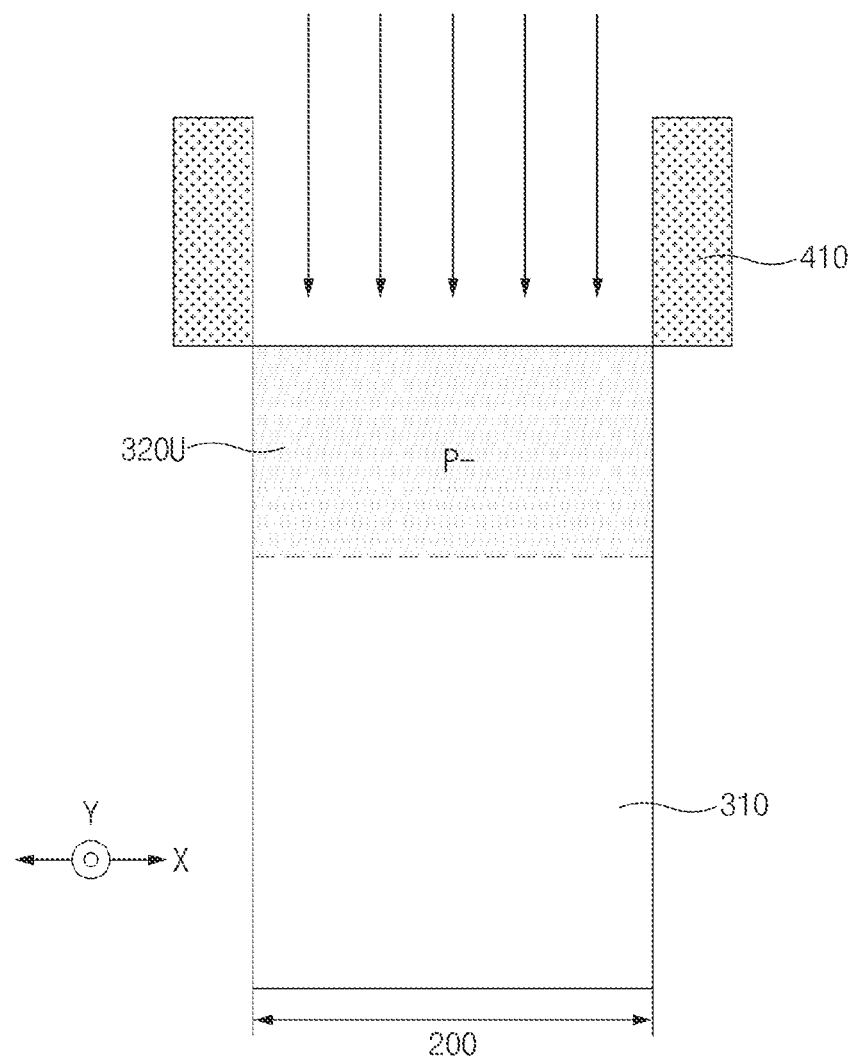
FIGS. 5A and 5B are cross-sectional views illustrating examples of a method for forming a well structure of a circuit region shown in FIG. 4A based on some implementations of the disclosed technology.
Figure 5B:
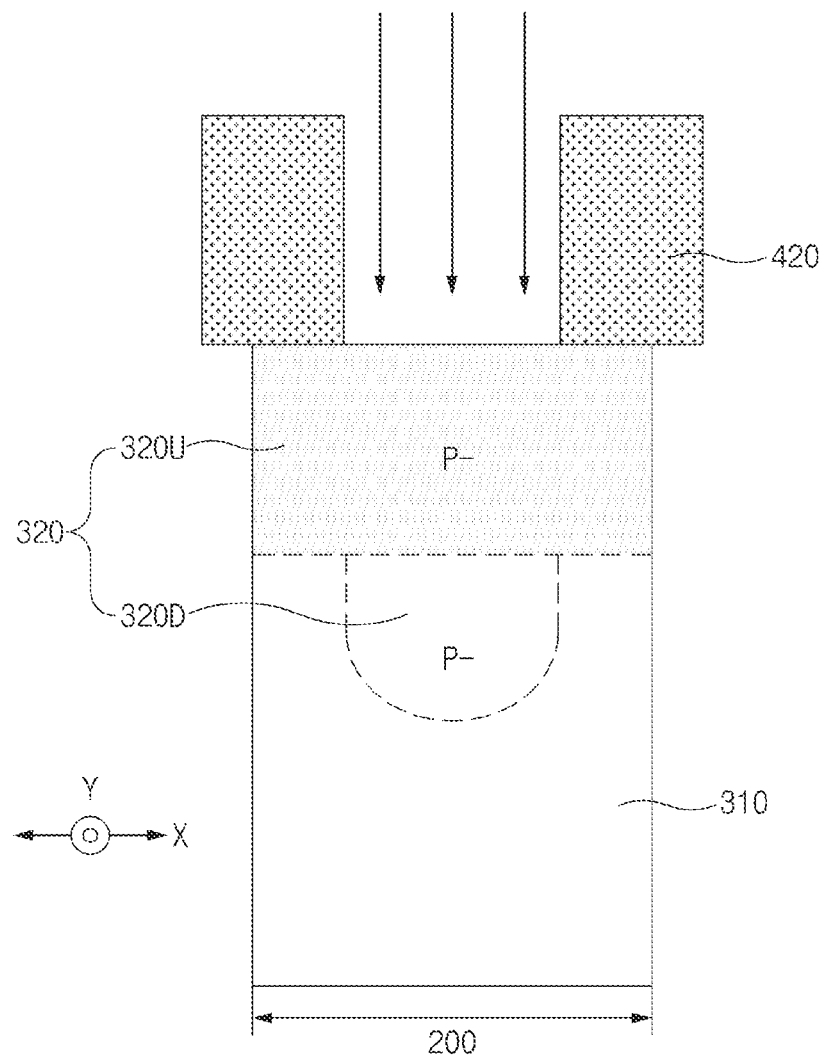

FIGS. 5A and 5B are cross-sectional views illustrating examples of a method for forming a well structure of the circuit region shown in FIG. 4A based on some implementations of the disclosed technology. For convenience of description, FIGS. 5A and 5B illustrate only the circuit region 200.

Referring to FIG. 5A, a mask pattern 410 for defining the circuit region 200 may be formed over the substrate 310. In some implementations, the mask pattern 410 may include a photoresist pattern.

Subsequently, P-type (P⁻) impurities may be implanted into the upper portion of the substrate 310 to a first depth through an ion implantation process using the mask pattern 410, forming the upper well region 320U. In some implementations, as shown in FIG. 4A, the upper well region 320U may be formed to a predetermined depth corresponding to the depth of the device isolation layer (ISO) for isolating the active region ACT of the circuit region 200 from the taps TA and TB of the photoelectric conversion region 100.

Referring to FIG. 5B, a mask pattern 420 for defining the lower well region 320D may be formed over the substrate 320 including the upper well region 320U. The mask pattern 420 may include a photoresist pattern.

Subsequently, P-type (P⁻) impurities may be implanted into a lower portion of the upper well region 320 to a second depth through an ion implantation process using the mask pattern 420, forming the lower well region 320D. In some implementations, the second depth may be less than the depth of the impurity region (P⁻ region) of the control nodes CNA and CNB.

Thereafter, the device isolation layer (not shown) for isolating the active region ACT including the upper well region 320U from the taps TA and TB of the photoelectric conversion region 100 may be formed. In some implementations, the device isolation layer may be formed to have a shallow trench isolation (STI) structure.

Figure 6A:
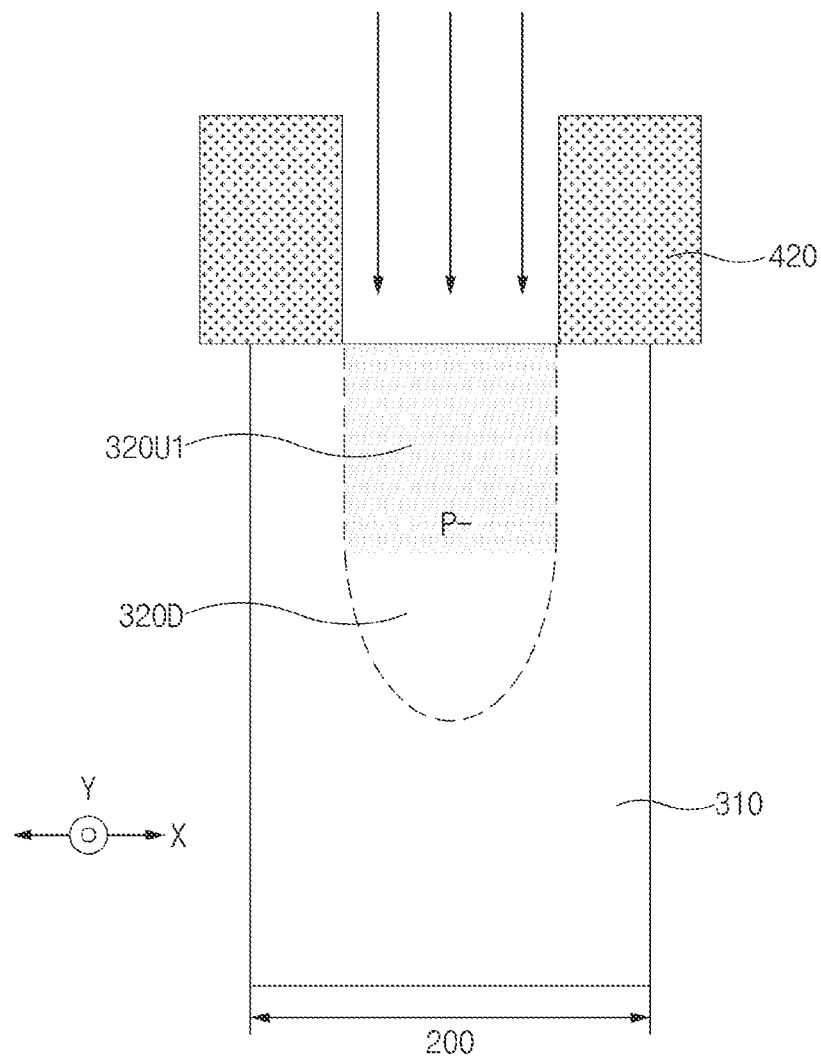
FIGS. 6A and 6B are cross-sectional views illustrating examples of another method for forming a well structure of a circuit region shown in FIG. 4A based on some implementations of the disclosed technology.
Figure 6B:
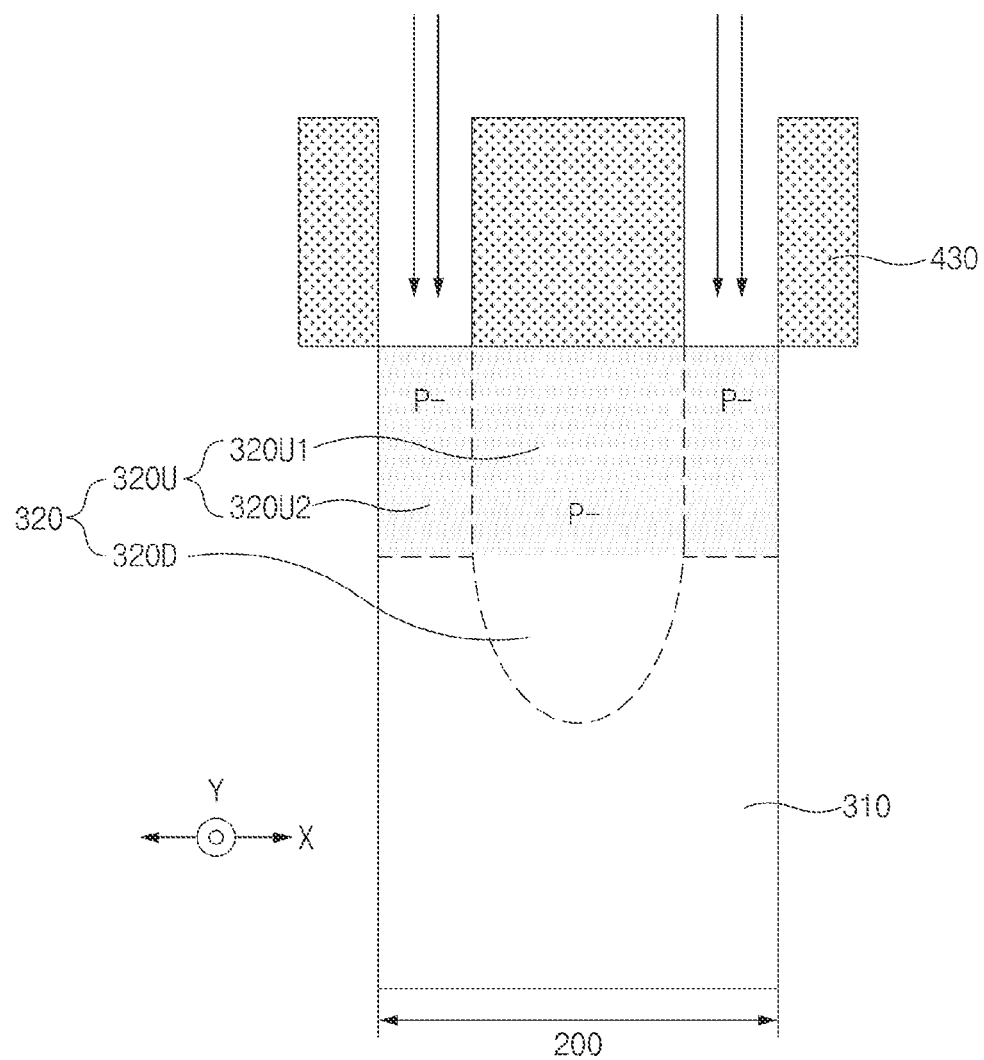

FIGS. 6A and 6B are cross-sectional views illustrating examples of another method for forming a well structure of the circuit region shown in FIG. 4A based on some implementations of the disclosed technology. For convenience of description, FIGS. 6A and 6B illustrate only the circuit region 200.

Referring to FIG. 6A, a mask pattern 420 for defining the lower well region 320D may be formed over the substrate 310.

Subsequently, P-type (P⁻) impurities may be implanted into the substrate 310 to a second depth from the top surface of the substrate 310 through ion implantation using the mask pattern 420, forming impurity regions 320U1 and 320D. In some implementations, the second depth may be less than the depth of the impurity region (P⁻ region) of the control nodes CNA and CNB.

Although FIG. 6A shows the impurity regions 320U1 and 320D as being distinct from one another, the impurity regions 320U1 and 320D may be formed to have the same doping concentration.

Referring to FIG. 6B, a mask pattern 430 may be formed over the substrate 310 in which the impurity regions 320U1 and 320D are formed. The mask pattern 430 may allow the remaining regions other than the impurity regions 320U1 and 320D in the circuit region 200 to be exposed outside.

Subsequently, a P-type (P⁻) impurity region 320U2 may be implanted into both sides of the impurity region 320U1 in the upper portion of the substrate 310 through ion implantation using the mask pattern 430, forming the impurity region 320U.

Thereafter, the device isolation layer (not shown) is formed to isolate the active region ACT including the upper well region 320U from the taps TA and TB of the photoelectric conversion region 100. In some implementations, the device isolation layer may be formed to have a shallow trench isolation (STI) structure.

As is apparent from the above description, the image sensing device based on some implementations of the disclosed technology can reduce power consumption and improve depth image characteristics.

Although a number of illustrative embodiments have been described, it should be understood that various modifications to the disclosed embodiments and other embodiments can be devised based on what is described and/or illustrated in this patent document.

What is claimed is:

1. An image sensing device comprising:
    a semiconductor substrate;
    a photoelectric conversion region supported by the semiconductor substrate and structured to generate charge carriers from incident light and capture the charge carriers using an electric potential difference caused by a demodulation control signal applied to the photoelectric conversion region; and
    a circuit region supported by the substrate and disposed adjacent to the photoelectric conversion region, the circuit region including a plurality of pixel transistors that generate and output a pixel signal corresponding to the charge carriers captured by the photoelectric conversion region,
    wherein the circuit region includes:
    a first well region formed to have a first length in a first direction; and
    a second well region formed below the first well region such that a lower end of the first well region is in contact with an upper end of the second well region, and formed to have a second length shorter than the first length in the first direction.

2. The image sensing device according to claim 1, wherein:
    the second length is longer than a length of an impurity region of the plurality of pixel transistors in the first direction.

3. The image sensing device according to claim 1, wherein:
    each of the first well region and the second well region extends in a second direction perpendicular to the first direction to have a third length that is longer than the first length.

4. The image sensing device according to claim 3, wherein:
    the third length is identical to a length of the circuit region in the second direction.

5. The image sensing device according to claim 1, wherein:
    the first well region and the second well region include a first impurity at the same doping concentration.

6. The image sensing device according to claim 1, wherein:
    the first well region is entirely formed in an active region that includes the plurality of pixel transistors.

7. The image sensing device according to claim 6, wherein:
    a length of a gate electrode of each of the pixel transistors in the first direction is shorter than a length of the active region in the first direction.

8. The image sensing device according to claim 1, wherein the photoelectric conversion region includes:
    a plurality of taps structured to control movement of the charge carriers by generating a pixel current in the semiconductor substrate using the electric potential difference, and capture the charge carriers moving by the pixel current.

9. The image sensing device according to claim 8, wherein:
    the second well region is formed to have a smaller depth than an impurity region of each of the plurality of taps.

10. The image sensing device according to claim 8, wherein the circuit region includes:
    an active region formed to include the plurality of pixel transistors and separated from the plurality of taps by a device isolation layer.

11. The image sensing device according to claim 10, wherein:
the second well region is arranged not to vertically overlap with the device isolation layer.

12. The image sensing device according to claim 8, wherein the plurality of taps includes:
a first control node and a second control node spaced apart from each other by a predetermined distance, and configured to generate the pixel current in the semiconductor substrate using the electric potential difference caused by the demodulation control signal;
a first detection node formed to surround the first control node, and configured to capture the charge carriers moving by the pixel current; and
a second detection node formed to surround the second control node, and configured to capture the charge carriers moving by the pixel current.

13. The image sensing device according to claim 12, wherein:
the first control node and the second control node include impurity regions doped with a first impurity at different doping concentrations.

14. The image sensing device according to claim 12, wherein:
the first detection node and the second detection node include impurity regions doped with a second impurity at different doping concentrations.

15. An image sensing device comprising:
a substrate including a first region and a second region adjacent to the first region;
a photoelectric conversion region formed in the substrate corresponding to the first region and including one or more demodulation nodes structured to receive a demodulation control signal and create an electric field and one or more detection nodes structured to collect photo generated charge carriers;
a circuit region including circuitry formed on the substrate corresponding to the second region to process the photo generated charge carriers collected by the one or more detection nodes;
a first well region doped with a first impurity and formed under the circuitry in the substrate corresponding to the second region to have a first width and a first depth; and
a second well region doped with a second impurity formed under the first well region in the substrate corresponding to the second region to have a second width and a second depth from a bottom surface of the first well region.

16. The image sensing device according to claim 15, wherein the first width is wider than the second width.

17. The image sensing device according to claim 16, wherein the second depth is larger than the first depth.

18. The image sensing device according to claim 16, wherein the second depth is smaller than the first depth.

19. The image sensing device according to claim 15, wherein the first impurity is the same as the second impurity.

20. The image sensing device according to claim 15, wherein the first well region has the same doping concentration as the second well region.

* * * * *